United States Patent
Wuidart et al.

(10) Patent No.: US 7,388,802 B2
(45) Date of Patent: Jun. 17, 2008

(54) MEMORY PROTECTED AGAINST ATTACKS BY ERROR INJECTION IN MEMORY CELLS SELECTION SIGNALS

(75) Inventors: Sylvie Wuidart, Pourrieres (FR); Mathieu Lisart, Aix En Provence (FR); Nicolas Demange, Saint Maximin la Sainte Baume (FR)

(73) Assignee: STMicroelectronics S.A., Montrouge (FR)

( * ) Notice: Subject to any disclaimer, the term of this patent is extended or adjusted under 35 U.S.C. 154(b) by 94 days.

(21) Appl. No.: 11/423,852

(22) Filed: Jun. 13, 2006

(65) Prior Publication Data

US 2007/0002616 A1    Jan. 4, 2007

(30) Foreign Application Priority Data

Jun. 15, 2005   (FR) .................................. 05 06034

(51) Int. Cl.
*G11C 8/00* (2006.01)
*G11C 5/06* (2006.01)
*G11C 7/00* (2006.01)
*G11C 8/02* (2006.01)
*G06F 12/00* (2006.01)

(52) U.S. Cl. .............. 365/230.01; 365/63; 365/189.11; 365/230.02; 365/231; 711/220

(58) Field of Classification Search ........... 365/189.01, 365/230.01, 230.02, 231; 711/220
See application file for complete search history.

(56) References Cited

U.S. PATENT DOCUMENTS

| | | | |
|---|---|---|---|
| 3,049,692 A | | 8/1962 | Hunt .................. 340/146.1 |
| 3,560,941 A | * | 2/1971 | Wallace, Jr. .............. 365/46 |
| 4,382,382 A | * | 5/1983 | Wang .................. 73/304 R |
| 4,463,339 A | * | 7/1984 | Frick et al. ............. 340/906 |
| 4,633,779 A | * | 1/1987 | Biggs et al. ............ 102/215 |
| 4,912,710 A | | 3/1990 | Rolfe ..................... 371/71 |
| 4,962,527 A | * | 10/1990 | Burns et al. ............ 379/418 |
| 5,123,105 A | * | 6/1992 | Wyland et al. .......... 710/244 |

FOREIGN PATENT DOCUMENTS

| | | |
|---|---|---|
| FR | 2 092 855 | 1/1972 |
| JP | 59-91726 | 5/1984 |
| JP | 10-63584 | 3/1998 |

* cited by examiner

*Primary Examiner*—Ly D Pham
(74) *Attorney, Agent, or Firm*—Lisa K. Jorgenson; Dennis M. de Guzman; Seed IP Law Group PLLC

(57) ABSTRACT

A memory comprises memory cells arranged in a memory array, and an address decoder to apply memory cells selection signals to the memory array according to a read address applied to the memory. The memory comprises an address reconstruction circuit which reconstructs at least one part of the read address from the memory cells selection signals, and supplies a first reconstructed address able to detect an error injection affecting the selection signals. Particularly but not exclusively applicable to the integrated circuits for chip cards.

23 Claims, 4 Drawing Sheets

US 7,388,802 B2

MEMORY PROTECTED AGAINST ATTACKS BY ERROR INJECTION IN MEMORY CELLS SELECTION SIGNALS

TECHNICAL FIELD

The present disclosure generally relates to the protection of integrated circuits against attacks by error injection, and particularly but not exclusively the protection of integrated circuits for chip cards.

The present disclosure more particularly but not exclusively relates to a method for securing the reading of a memory in an integrated circuit, and applies in particular but not exclusively to non volatile memories like ROM, EEPROM and FLASH memories.

BACKGROUND INFORMATION

In the last years, the techniques for pirating secured integrated circuits have significantly evolved. Nowadays, the more advanced pirating techniques comprise injecting errors into determined points of an integrated circuit during the execution of so-called sensitive operations, for example authentication operations or operations of execution of an encryption algorithm. Such attacks by error injection, also called attacks by fault injection, make it possible, in combination with mathematical models, to deduce the structure of a wired-logic encryption algorithm and/or the secret keys it uses. Error injection can be made in various ways, by introducing glitches in the supply voltage of the integrated circuit, by introducing glitches in the clock signal of the integrated circuit, by exposing the integrated circuit to radiations or a laser beam, etc.

The memories present in these integrated circuits are particularly subject to this type of attack, since they contain confidential data (e.g., secret keys, passwords . . . ) that the defrauder tries to obtain.

A known method to detect an integrity defect in a memory, that is the presence of not valid data, is to verify the content of a memory, for example at the start of the integrated circuit or when read or write accessing the memory. However, such verifications cannot lead to the detection of the attacks that do not change the memory content and that only lead the memory to read data which are not those meant to be read.

This type of attack will be better understood by referring to FIG. 1, which shows a memory 1 comprising memory cells MC arranged in a memory array MA and linked to at least one address decoder ADEC by control lines CTLi. The decoder ADEC applies to the control lines CTLi memory cells selection signals Si which depend on an address ADi applied to the memory.

When an error aiming at altering data reading is injected in the memory, the error injected generally aims at the address decoder and causes a dysfunction of the same which affects the selection signals Si, so that the selected memory cells and the data read out of the memory array are not those corresponding to the address ADi.

U.S. Pat. Nos. 3,049,692 and 4,912,710 disclose a memory comprising an address decoder providing selection signals of memory cells from an address, and an encoder reconstructing an address from the selection signals applied to the memory cells. The original address and the reconstructed address are compared. In U.S. Pat. No. 3,049,692, the address is reconstructed from the memory cell selection signals using magnetic cores.

BRIEF SUMMARY OF THE INVENTION

Thus, one embodiment of the present invention provides a simple and efficient way to counter attacks aiming at altering the memory cells selection signals.

An embodiment of the present invention suggests reconstructing the address from a datum read out of the memory array from the selection signals applied to the memory array. The address reconstruction is performed in real time, that is at reading the datum and when the selection signals are still present. Such an address reconstruction makes it possible to verify that the reconstructed address, which is the real address of the datum read out of the memory array, corresponds to the address applied to the memory.

More particularly, one embodiment of the present invention provides a method for reading a datum out of a memory comprising memory cells arranged in a memory array, comprising applying memory cells selection signals to the memory array according to a read address applied to the memory, and reconstructing at least one part of the read address from the memory cells selection signals, to obtain a first reconstructed address.

According to one embodiment, a bit of the reconstructed address is reconstructed by using switches arranged to bias to a first logic state a common output node which is biased by default to a second logic state, and by applying the memory cells selection signals to control terminals of the switches.

According to one embodiment, the method comprises comparing the first reconstructed address with at least one part of the read address, and activating a first error signal if the reconstructed address is different from the read address.

According to one embodiment, the method comprises producing a second reconstructed address from the selection signals which forms the 1's complement of the first reconstructed address, comparing the first and the second reconstructed addresses, and activating a second error signal if at least one bit of the second reconstructed address is equal to a bit of the same rank of the first reconstructed address.

According to one embodiment, the method comprises activating a global error signal if at least one of the two error signals is activated.

According to one embodiment, the reconstructed address comprises the same number of bits as the read address.

According to one embodiment, the selection signals are converted into low-voltage signals before being applied to control terminals of the switches.

According to one embodiment, the method is applied to a memory comprising a memory array comprising memory cells connected to word lines and to bit lines, the bit lines being arranged into columns to form columns, a line decoder supplying word line selection signals according to the read address, a column decoder supplying column selection signals according to the read address, and the reconstructed address is both determined by word line selection signals and column selection signals.

An embodiment of the invention also relates to a memory comprising memory cells arranged in a memory array, an address decoder to apply memory cells selection signals to the memory array according to a read address applied to the memory, and an address reconstruction circuit which supplies a first reconstructed address reconstructing at least one part of the read address from the memory cells selection signals.

According to one embodiment, the address reconstruction circuit comprises at least one group of switches arranged to bias to a first logic state an output node common to the switches, which supplies a bit of the reconstructed address, an element to bias the output node by default to a second logic state, and means to apply memory cells selection signals to control terminals of the switches.

According to one embodiment, the memory comprises a comparison circuit which compares the reconstructed address with at least one part of the read address, and which activates a first error signal if the reconstructed address is different from the read address.

According to one embodiment, the address reconstruction circuit also supplies a second reconstructed address which forms the 1's complement of the first reconstructed address.

According to one embodiment, the memory comprises a comparison circuit which compares the first and the second reconstructed addresses, and activates a second error signal if at least one bit of the second reconstructed address is equal to a bit of the same rank than the first reconstructed address.

According to one embodiment, the address reconstruction circuit comprises address reconstruction modules having common outputs and operating alternately to alternately supply different parts of the reconstructed address.

According to one embodiment, the memory comprises a memory array comprising memory cells connected to word lines and to bit lines, bit lines being arranged into columns to form word columns, a line decoder supplying word line selection signals according to the read address, a column decoder supplying column selection signals according to the read address, a word line address reconstruction circuit, supplying a reconstructed word line address from the word line selection signals, and a column address reconstruction circuit, supplying a reconstructed column address from the column selection signals.

According to one embodiment, the memory comprises an interface circuit to insulate the address reconstruction circuit from the selection signals applied to the memory array when the memory is not in a reading phase of the memory array.

According to one embodiment, the memory comprises an interface circuit to lower the voltage of the selection signals applied to the memory array before applying them to the address reconstruction circuit.

According to one embodiment, the interface circuit comprises components of not used memory cells that are present on edges of the memory array.

BRIEF DESCRIPTION OF THE SEVERAL VIEWS OF THE DRAWINGS

These and other features of one or more embodiments of the present invention will be presented in greater detail in the following description in relation with, but not limited by, the following figures.

DETAILED DESCRIPTION

Embodiments of a memory protected against attacks by error injection in memory cells selection signals are described herein. In the following description, numerous specific details are given to provide a thorough understanding of embodiments. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
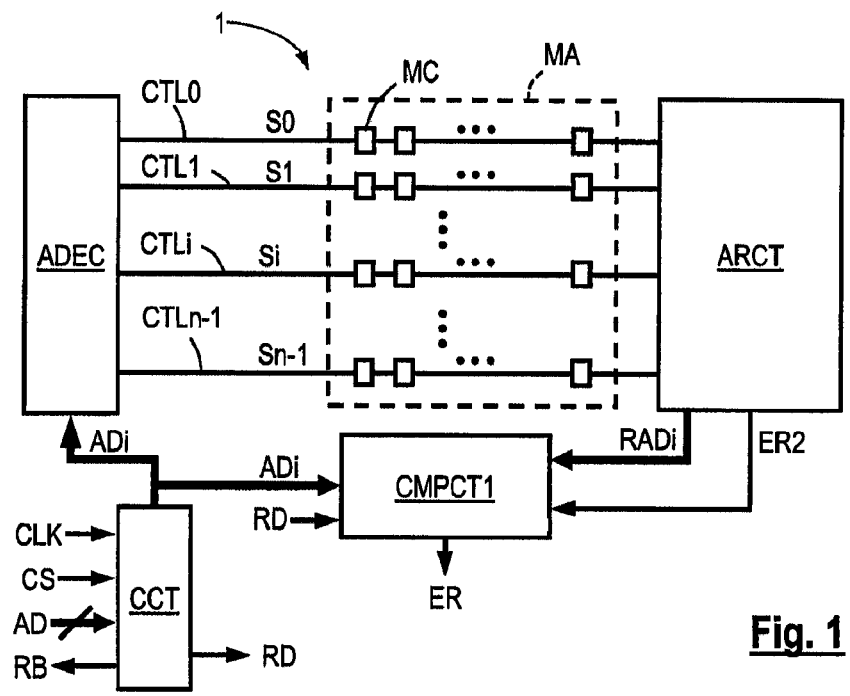
FIG. 1, partially described above, schematically represents a memory comprising a read monitoring device according to an embodiment of the invention.

FIG. 1, partially described above, represents a memory 1 of standard architecture comprising a memory array MA, an address decoder ADEC and a control circuit CCT.

The memory array MA comprises memory cells MC connected to control lines CTLi, i being an index varying from 0 to n−1, n being the number of control lines of the memory. The control circuit CCT receives a read address AD, a clock signal CLK and a chip select signal CS for selecting the memory. It supplies a Read internal signal RD, a Ready/Busy external signal RB which indicates whether the memory is busy or not, and applies to the decoder ADEC an address ADi, which depends on the address AD received. Upon reception of the address ADi and of the read signal RD, the decoder ADEC applies to the control lines CTLi selection signals Si (S0 to Sn-1) which allow one or several memory cells designated by the address ADi to be read accessed.

According to one embodiment of the invention, the memory 1 comprises a read monitoring device comprising an address reconstruction circuit ARCT and an address comparison circuit CMPCT1.

The circuit ARCT supplies a reconstructed address RADi which is elaborated in real time from the selection signals Si applied by the decoder ADEC to the memory array MA. The comparison circuit CMPCT1 compares the address ADi applied to the decoder ADEC with the reconstructed address RADi, for example on the fly to avoid resorting to address storage means, and supplies an error signal ER representative of the result of the comparison. The signal ER is for example equal to 0 if the addresses ADi and RADi are identical, and equal to 1 if they are different.

The error signal ER can be used in different ways. For example, the error signal ER is applied to the control circuit CCT which puts the memory into error mode when the error signal goes to 1 at the end of a read operation. In error mode, the control circuit CCT emits for example an external error signal (not shown) to the attention of a processing unit, which can decide to reset the whole circuit into which the memory is integrated (such a master reset being recommended with an integrated circuit for chip card).

Figure 2:
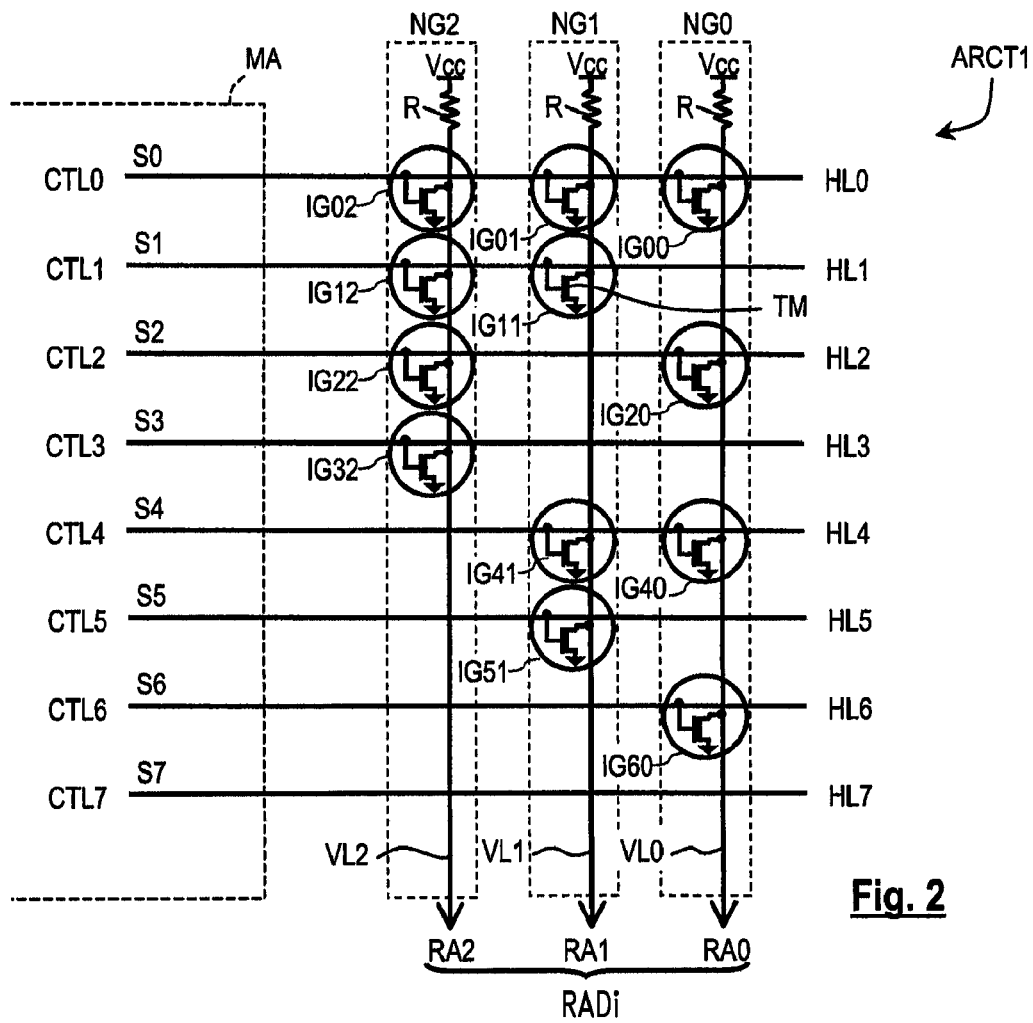
FIG. 2 represents an embodiment of an address reconstruction circuit according to the invention represented in block form in FIG. 1.

FIG. 2 represents an embodiment of an address reconstruction circuit ARCT1 according to the invention, in the simple case where the memory array MA only comprises 8 control lines CTL0 to CTL7. In this case, the decoder ADEC receives an address ADi of three bits A2, A1, A0 and supplies eight selection signals S0 to S7 applied to the control lines CTL0 to CTL7.

The structure of the circuit ARCT1 is determined from the decoding function executed by the decoder ADEC, described by the Table 1 hereinafter (Cf. Appendix). This decoding function defines the value of the selection signals S0 to S7 according to the value of the address bits A2, A1, A0. Here it is assumed that a selection signal S0 to S7 is put to 1 (active value) when the corresponding control line CTL0 to CTL7 is designated by the address ADi.

To determine the address reconstruction function, or address encoding function, to be performed by the circuit ARCT2, Tables 2, 3 and 4 hereinafter (Cf. Annex) are taken from Table 1 in order to show the relations existing between the values of the selection signals S0 to S7 and the address bits A2, A1, A0 when they are 1.

It appears that the bit A2 only depends on S0, S1, S2, S3, the bit A1 only depends on S0, S1, S4, S5 and the bit A0 only depends on S0, S2, S4, S6. The following relations are deduced:

$$A2=/S0*/S1*/S2*/S3 \quad (1)$$

$$A1=/S0*/S1*/S4*/S5 \quad (2)$$

$$A0=/S0*/S2*/S4*/S6 \quad (3)$$

"*" being the AND function, and "/" the NOT function,

The relations 1 to 3 can also be written by means of the NOR function:

$$A2=/(S0+S1+S2+S3) \quad (1')$$

$$A1=/(S0+S1+S4+S5) \quad (2')$$

$$A0=/(S0+S2+S4+S6) \quad (3')$$

"+" being the OR function.

The circuit ARCT1 is arranged to implement the relations 1, 2, 3 and comprises here:

eight input nodes, here in the shape of eight horizontal lines HL0, HL1, . . . HL7, three output nodes, here in the shape of three vertical lines VL0, VL1, VL2, and elementary inverting gates IGxy, each inverting gate being connected to an input node HL0 to HL7 and to an output node VL0, VL1, VL2, "x" being the rank of the input node (horizontal line) and "y" the rank of the output node (vertical line) to which the gate is connected.

Each input node HL0, HL1 . . . HL7 is linked to a control line CTL0, CTL1, . . . CTL7 of the memory array MA and copies out the control signal S0, S1, . . . S7 applied to the control line. The connection between the control lines CTL0 to CTL7 and the input nodes HL0 to HL7 can be a simple wire to wire connection, as shown, or a connection by means of an interface circuit described below.

Each elementary inverting gate IGxy is formed here by a pull-down transistor TM of the NMOS type. The transistor gate TM forms the input of the inverting gate and is linked to one of the input nodes HL0 to HL7, the transistor drain terminal forms the output of the inverting gate and is linked to one of the output nodes VL0 to VL2. The source terminal of the transistor is put to the ground. In addition, each output node V0O to VL2 is linked to a pull-up element, here a resistor R which anode receives a voltage Vcc. Each output node VL0 to VL2 is thus retained to high state by default and switches to low state if at least one inverting gate to which it is connected switches to low state (transistor TM ON).

This arrangement of elementary inverting gates linked to a common pulled-up output node, forms an AND function having inverted inputs, that is a NOR function in relation to the signals S0 to S7.

More particularly, the circuit ARCT1 comprises here three groups of inverting gates respectively linked to the output nodes VL0, VL1, VL2, which form three gates NG2, NG1, NG0 of the NOR type. The gate NG2 comprises inverting gates IG02, IG12, IG22, IG32 which inputs respectively receive the signals S0, S1, S2, S3 and which outputs are connected to the node VL2. The gate NG2 thus supplies a bit of reconstructed address RA2 which corresponds to the bit A2, in accordance with the relation 1. The gate NG1 comprises inverting gates IG01, IG11, IG41, IG51 which inputs respectively receive the signals S0, S1, S4, S5 and which outputs are connected to the node VL1, and supplies a bit of reconstructed address RA1 which corresponds to the bit A1 in accordance with the relation 2. Finally, the gate NG0 comprises inverting gates IG00, IG20, IG40, IG60 which inputs respectively receive the signals S0, S2, S4, S6 and which outputs are connected to the node VL0, and supplies a bit of reconstructed address RA0 which corresponds to the bit A0 in accordance with the relation 3. Together, the bits of reconstructed address RA0, RA1, RA2 form the reconstructed address RADi.

This structure of address reconstruction circuit ARCT1 is advantageous because it is simple. It is based upon the achievement of a NOR function by using pull-down switches and output nodes pulled up by default. In addition, the provision of horizontal lines as input nodes and vertical lines as output nodes is adapted to the location of the circuit ARCT1 in the continuation of the memory array.

It will be noted that the last horizontal line HL7, although shown in FIG. 2, is not necessary here for the reconstruction of the address "111". But the line HL7 is necessary to produce an address forming the 1's complement of the reconstructed address RADi, this aspect of the invention being described hereinafter.

In practice, the location of the pull-down transistors TM can be determined without calculation step by reorganizing Table 1 so as to represent the 1's values of the address bits AD0 to AD2 as a function of the values of the selection signals S0 to S7. The Table 5 hereinafter is obtained (Cf. Appendix), wherein each box corresponds to an intersection of a horizontal line HL0 to HL7 and of a vertical line VL0 to VL2. Each equal box comprising the value 0 corresponds to a location of a pull-down switch TM.

The address reconstruction circuit can also be manufactured with pull-up switches, forming follower gates, for example by linking the source terminal of the transistors TM to one of the vertical lines VL0, VL1, VL2 and by applying the voltage Vcc to their drain terminal. In this case, the lines VL0, VL1, VL2 are pulled down by default, for example using a grounded resistor. The location of the pull-up switches is indicated by Table 6 hereinafter (Cf. Annex). Each box of Table 6 comprising the value 1 corresponds to a location of a switch at the intersection of a vertical line VL0, VL1, VL2 and of a horizontal line HL0 to HL7. This embodiment is applicable when the voltage of the selection signals Si is enough to transfer the voltage Vcc from the drain terminal to the source terminal of the transistors (which is usually the case).

Figure 3:
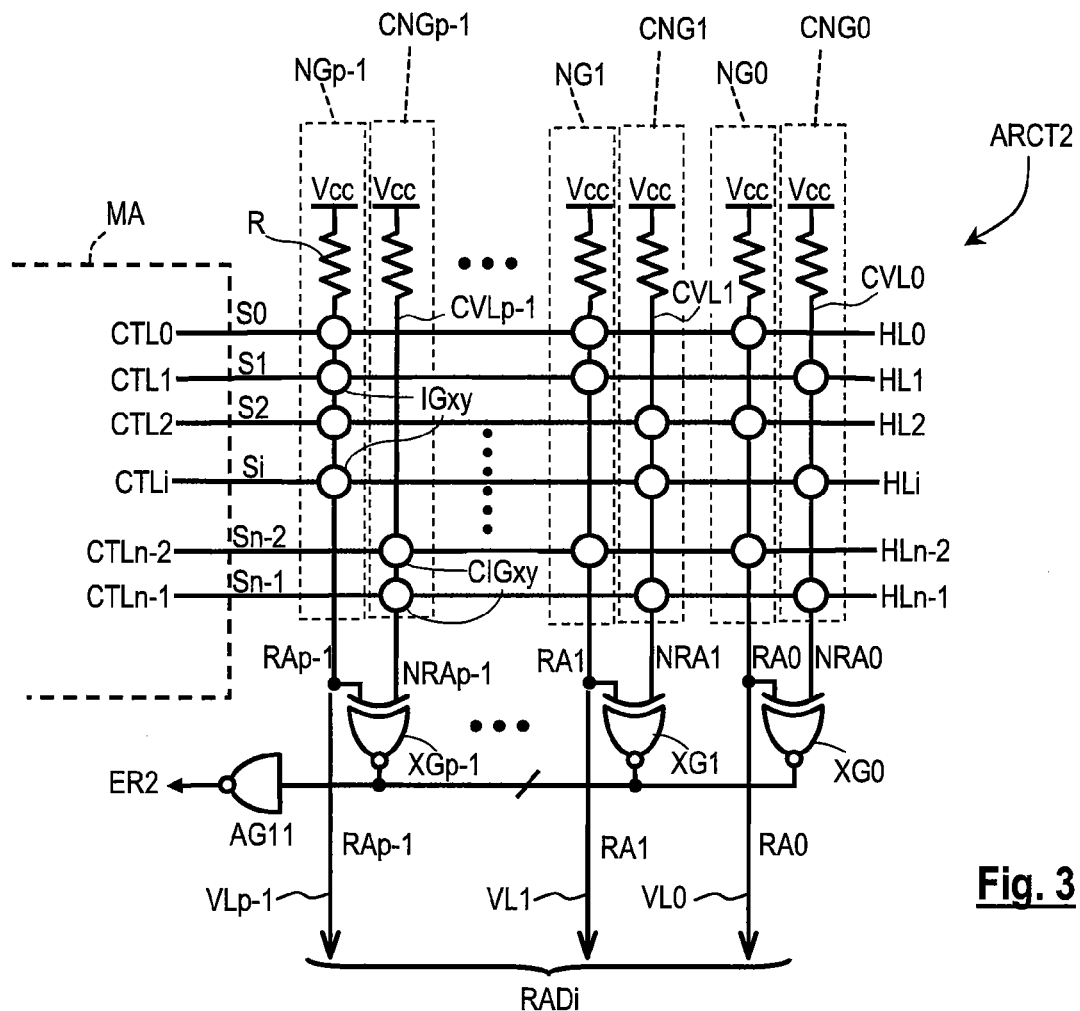
FIG. 3 represents another embodiment of an address reconstruction circuit according to the invention.

FIG. 3 represents an address reconstruction circuit ARCT2 manufactured according to the same principle than the circuit ARCT1 but generalized to a structure of memory array MA comprising control lines CTL0, CTL1 ... CTLn-1 corresponding to p bits of address A0 to Ap-1, where n=2p.

The circuit ARCT2 thus comprises horizontal lines HLi (HL0, HL1 ... HLn-1) forming input nodes and copying selection signals Si (S0, S1 ... Sn-1) of the memory array MA, vertical lines VL0 to VLp-1 forming output nodes, biased to the voltage Vcc by a resistor R, and elementary inverting gates IGxy schematically indicated by circles, each inverting gate receiving one of the selection signals Si. As previously, these various elements form elementary NOR gates NG0 to NGp-1 supplying the bits RA0 to RAp-1 of the reconstructed address RADi.

As an answer to the technical problem explained in the preamble, the comparison of the reconstructed address RADi with the address applied ADi makes it possible to detect an error of a first type rendered by the activation in the memory array MA of a single selection signal Si, not corresponding to the one designated by the address ADi applied to the decoder ADEC.

However, this comparison does not make it possible to detect an error of a second type, that would be rendered by the simultaneous activation of two selection signals, since in this case, the reconstructed address RADi could still correspond to the address applied ADi (Cf. Table 5, assuming for example that the signal S2 is activated by the decoder, but that S3 is simultaneously activated by an error injection, the reconstructed address being S2 address since the signal S2 imposes the 0 on the line VL0).

Thus, according to an optional but advantageous aspect of the invention, the circuit ARCT2 comprises complementary NOR gates CNG0 to CNGp-1 allowing an error of the second type to be detected. The complementary NOR gates are manufactured according to the same architecture as the "basic" NOR gates (gates NG0 to NGp-1), by providing complementary pulled-up vertical lines CVL0 to CVLp-1 and pull-down transistors forming elementary inverting gates CIGxy which outputs are linked to the vertical lines CVL0 to CVLp-1. The inputs of each complementary NOR gate are linked to the horizontal lines HL0 to HLn-1 to which the basic NOR gate of corresponding rank is not linked. For example, if a basic NOR gate is linked to the lines HL0 to HL4, the complementary NOR gate is linked to the lines HL5 to HLn-1.

Each complementary NOR gate thus supplies an reconstructed inverted bit of address NRA0 to NRAp-1 which logical value is the opposite of the value of the reconstructed bit of address RA0 to RAp-1 of corresponding rank. The reconstructed inverted bits of address NRA0 to NRAp-1 form a reconstructed address NRADi which is the 1's complement (binary complement) of the reconstructed address RADi.

Each reconstructed bit of address RA0 to RAp-1 is applied to the input of a gate XG0 to XGp-1 of the Exclusive OR type with its complement NRA0 to NRAp-1. The outputs of the gates XG0 to XGp-1 are applied to a gate AG11 of the NAND type having p inputs, and which output supplies an error signal ER2.

In the absence of error of the second type, the output of each gate XG0 to XGp-1 is at 1 since each gate receives a reconstructed bit of address and its complement (the inverted reconstructed bit of address). The signal ER2 is then at 0. If an error of the second type appears, e.g., if at least two selection signals S0 to Sn-1 are simultaneously activated on the control lines CTL0 to CTLn-1 of the memory array, it is inevitably rendered by an identity between at least one bit of the address RADi and one bit of the complementary address NRADi. Thus, one of the gates XG0 to XGp-1 goes to 0 and the signal ER2 goes to 1.

Secondarily, the signal ER2 makes it possible to detect a third type of error which can produce if the address decoder supplies no selection signal in reply to the address applied Adi. In that case, the address RADi and its complement NRADi are strictly identical, so that all the gates XG0 to XGp-1 go to 0.

Figure 4:
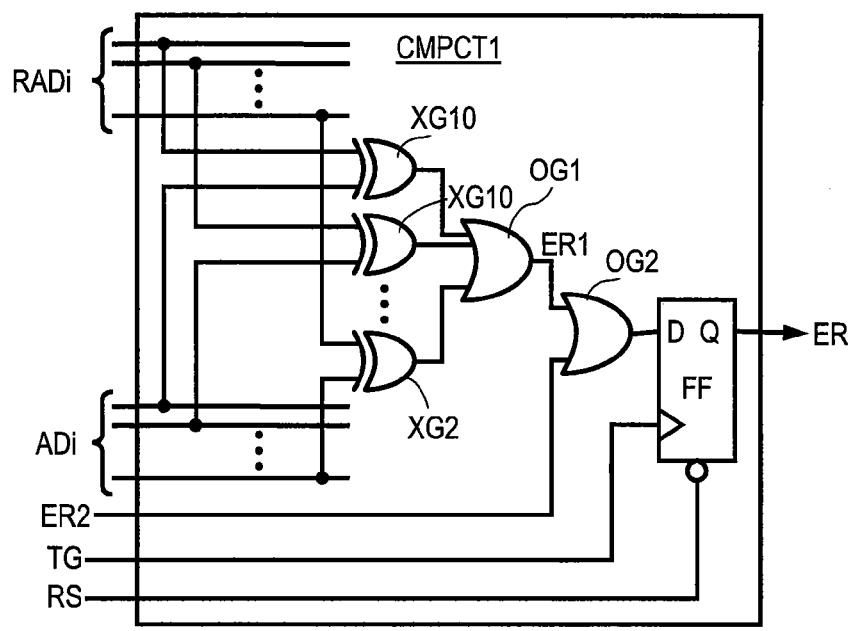
FIG. 4 is the logical diagram of an embodiment of a comparison circuit present in the monitoring device of FIG. 1.

FIG. 4 represents an embodiment of the comparison circuit CMPCT1, provided to manage the errors of the first, the second and the third types at the same time. The comparison circuit comprises gates XG10 with two Exclusive OR inputs, each receiving a bit of the address ADi applied to the decoder ADEC and a bit of the reconstructed address RADi. The outputs of all the gates XG10 are applied to a OR gate OG1 which output supplies an error signal ER1 which goes to 1 when the reconstructed address is not equal to the address applied. The error signal ER1 is applied to an input of a OR gate OG2 which other input receives the error signal ER2. The output of the gate OG2 supplies the error signal ER which is thus a general error signal going to 1 when an error of the first type or of the second type is detected.

To synchronize the error signal ER with the read cycles, it is applied to the output D of a flip-flop FF having an active clock input on trailing edge which receives a triggering signal TG, for example the read signal RD emitted by the control circuit. On the trailing edge of the signal RD, indicating the end of a read cycle, the output Q of the flip-flop FF copies out the error signal ER. The flip-flop also has a reset input receiving a signal RS ensuring its reset after detection and process of an error.

Figure 5:
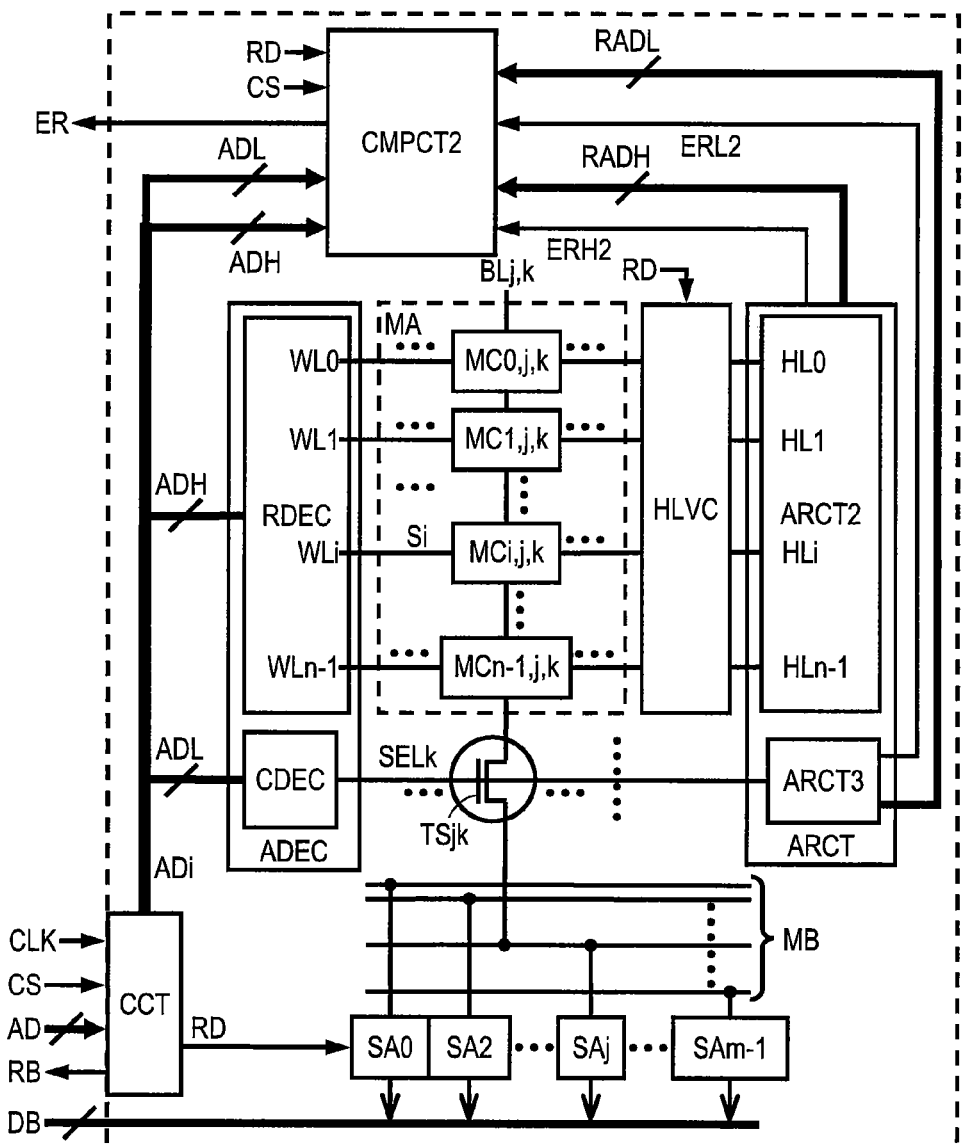
FIG. 5 is a more detailed representation of a memory comprising a monitoring device according to an embodiment of the invention, FIG. 6 schematically represents an embodiment of an interface circuit present in the memory of FIG. 5.

FIG. 5 represents an application of an embodiment of the invention to an EEPROM memory 2 comprising, like the memory 1, a memory array MA, a control circuit CCT, an address reconstruction circuit ARCT according to an embodiment of the invention and a comparison circuit CMPCT2 according to an embodiment of the invention.

Here, the memory array MA comprises electrically erasable and programmable memory cells MCi,j,k which are connected to horizontal word lines WLi and vertical bit lines BLj,k. The bit lines are gathered into columns of rank k, and each comprises m bit lines, i being an index of word line, j being an index of bit line ranging from 0 to m-1, m being the number of bits by column, and k being a column index. The memory array thus defines binary words of m bits each, along the word lines Wli.

The memory also comprises m read amplifiers SAj (SA0 to SAm-1) and each bit line BLj,k is linked to an amplifier SAj by a selection transistor TSjk and a multiplexing bus MB.

The address decoder ADEC comprises a word line decoder RDEC and a column decoder CDEC. The word line decoder RDEC drives the word lines WLi by means of the selection signals Si described above. The column decoder CDEC supplies column selection signals SELk which are applied to the transistors TSjk. The transistors TSjk ensuring the selection of the bit lines of a same column, that is, the transistors of the same rank k, are driven by the same signal SELk. Thus, upon selection of a word line WLi and of a column of rank k, the read amplifiers SAj read the m memory cells MCi,j,k of the selected word of rank i, k. The data read are fed into a data bus DB.

As previously, the control circuit CCT receives a read address AD, a clock signal CLK, a selection signal CS, and supplies a ready/busy signal RB and the internal read signal RD ensuring in particular the activation of the read amplifiers. The circuit CCT also supplies a word selection address ADi which is here broken into a word line address ADH applied to the decoder RDEC and a column address ADL applied to the decoder CDEC, the address ADH comprising the most significant bits and the address ADL the least significant bits of the address ADi.

The address ADi is usually equal the address received AD but steps of converting virtual address into physical address can take place within the control circuit CCT, in some interleaving data memory. Anyway, for simplicity reasons, the address ADi and the address AD are considered to be identical since, even if they are not, they remain linked by a known conversion relation.

Here, the circuit ARCT comprises a word line address ADH reconstruction circuit ARCT2, identical to the one described above, which references are retained. It also comprises an optional reconstruction circuit ARCT3 of column address, of the same structure than the circuit ARCT2 but receiving column selection signals SELk as input signals.

Thus, the circuit ARCT2 supplies a reconstructed word line address RADH and the circuit ARCT3 supplies a reconstructed column address RADH, both reconstructed addresses forming together a reconstructed word address RADi presumed to be corresponding to the address ADi. The circuit ARCT2 also supplies an error signal ERH2 which active value indicates, if need be, an error of the second type at the level of word lines selection, and the circuit ARCT3 supplies an error signal ERL2 which active value indicates, if need be, an error of the second type at the level of columns selection. The circuit ARCT3 having a global structure similar to the circuit ARCT2, it will not be described in detail.

The comparison circuit CMPCT2 supplies the global error signal ER and compares the address ADH with the reconstructed address RADH on the one hand, and the address ADL with the reconstructed address RADL on the other hand, incorporating at the same time the error signals ERH2 and ERL2 in the error signal ER. The error signal ER thus goes to 1 if at least one error out of four types of errors is detected.

In addition, the memory 2 comprises an interface circuit HLVC to insulate the memory array MA from the circuit ARCT2 outside reading phases, in particular during programming phases. The circuit HLVC comes in between the word lines WLi and the inputs of the circuit ARCT2 (horizontal lines HLi). It can comprises, if need be, means of converting the voltage of the selection signals Si applied to word lines WLi to a voltage of lower value.

Figure 6:
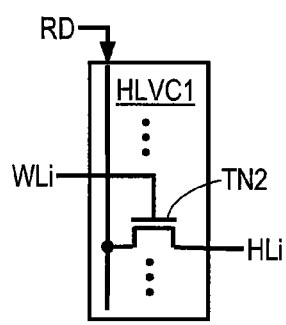

FIG. 6 partially represents an embodiment HLVC1 of the interface circuit including a voltage conversion function. For each word line WLi, the circuit HLVC1 comprises a NMOS transistor TN2 which gate is connected to the word line WLi, which drain terminal receives a read signal RD emitted by the control circuit CCT and which source terminal is connected to the corresponding HLi of the circuit ARCT2 (input node, Cf. FIG. 2 or 3).

When the signal RD is 0, the transistor TN2 is blocked and the circuit HLVC1 insulates the circuit ARCT2 from the memory array MA. When the signal RD is 1 (reading phase) and the word line WLi is selected (selection signal Si to the active value) the transistor TN2 becomes conducting and supplies a voltage to the line HLi which is substantially equal to the voltage of the signal RD (when the voltage drop in the transistor TN2 is ignored), the latter is generally inferior to the one of the selection signals Si applied to the word line WLi.

Figure 7:
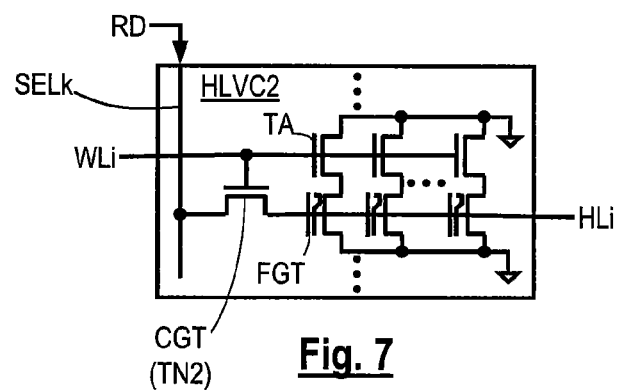
FIG. 7 represents another embodiment of the interface circuit, and FIG. 8 schematically represents still another embodiment of an address reconstruction circuit according to the invention.

FIG. 7 shows an embodiment of an interface circuit HLVC2 wherein structures of dummy memory cells located on the edges of the memory array MA are advantageously used so as to form the voltage level conversion transistors TN2. These dummy memory cells are usually provided on the edge of the memory array not to be submitted to "edge" effects. A group of dummy memory cells forming a binary word is represented in FIG. 7. Each memory cell, of the EEPROM type, generally comprises a floating gate transistor FGT and an access transistor TA. The access transistors gates are linked by a common line, and the transistors FGT gates are connected to the source terminal of a common control gate transistor CGT. The gate of the latter is connected to the common line and its drain terminal linked to a column selection line SELk (which is not linked to the control units of the memory array).

Thus, to manufacture the interface circuit HLVC2, the drain terminals of the access transistors TA and the source terminals of the FGT transistors of the dummy memory cells are connected to the ground. The read signal RD is applied to the line SELk connected to the drain terminal of the transistor CGT and the source terminal of the transistor CGT is connected to the corresponding input HLi of the circuit ARCT2. In these conditions, the size of the interface circuit HLVC2 can be considered as equal to zero since it is implanted in an area of the memory array which is normally not used.

The size of the circuit ARCT2, in terms of occupied silicon surface, is mainly determined in "height" by horizontal lines HL0 to HLn-1 (input nodes), and more particularly by the number of horizontal lines and their spacing. Equally, the size of the circuit ARCT2 in "width" is mainly determined by the number and spacing of the vertical lines VL0 to VLp-1 and CVL0 to CVLp-1 (output nodes). However, even with a memory requiring relatively high read voltages on the word lines, the interface circuit HLVC makes it possible to use low-voltage address encoding transistors of small dimensions. The use of such transistors thus enable free spaces to be kept between the horizontal lines HLi, which number and spacing is imposed by the word lines of the memory array MA.

Here, an idea of one embodiment of the invention is to use the available space between the horizontal lines to reduce the width of the surface occupied by the circuit ARCT2 by reducing the number of vertical lines VL0 to VLp-1 and CVL0 to CVLp-1, for example by half.

Figure 8:
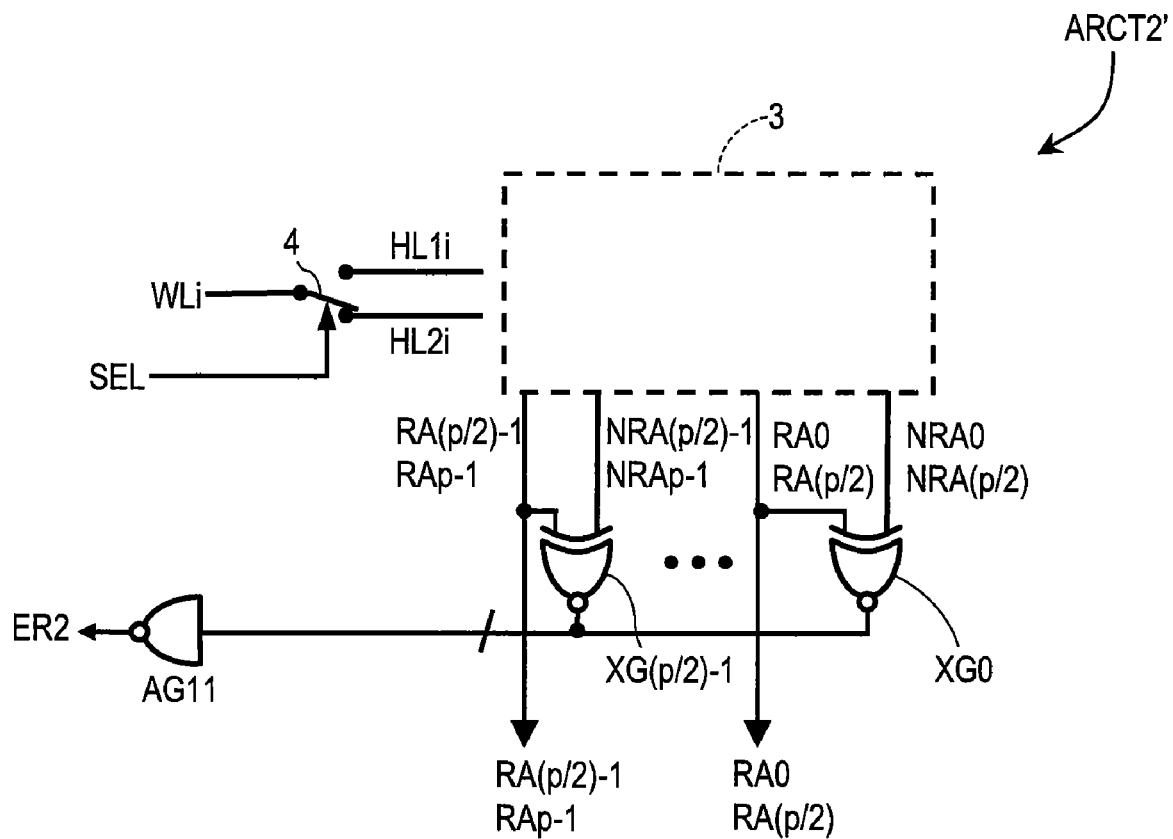

The structure of the circuit ARCT2 can be modified for example in the way shown in FIG. 8, assuming here that the number p of address bits to be reconstructed is even. The circuit ARCT2' represented in FIG. 8 comprises an address reconstruction matrix schematically represented in the shape of a block 3, which derives from the one represented in FIG. 3 and comprises two horizontal lines HL1i and HL2i for each word line WLi of the memory array. In compensation, the number of vertical lines (that is the number of elementary NOR gates) is divided by two.

More particularly, the transistors encoding two different address bits are linked to the same vertical line (that is, to the same output node), the gates of the transistors encoding the first address bit are connected to the horizontal lines HL1i and the gates of the transistors encoding the second address bit are connected to the horizontal lines HL2i, thus forming two different address reconstruction modules. Changeover switches 4 enable each word line WLi to be selectively linked to the line HL1i or to the line HL2i according to the value of a selection signal SEL, so that the transistors of two different address reconstruction modules cannot be active at the same time.

According to the position of the changeover switches 4, the address reconstruction circuit ARCT2 supplies either the most significant bits or the least significant bits of the reconstructed address RADi or ADH. During a first cycle, the changeover switches 4 are controlled to link the lines HL1i (i=0 to n−1) to the word lines WLi and obtain address bits RA0 to RA(p/2)-1, that is the least significant bits of the reconstructed address, as well as their complements. During a second cycle, the changeover switches 4 are controlled to link the lines HL2i to the word lines WLi and obtain the most significant bits RA(p/2) to RAp-1 of the address RADi and their complements. Both address reconstruction cycles are performed during two reading cycles of a datum in the memory, or during the same read cycle.

In the light of the examples described above, it will be clear to those skilled in the art that the method according to the embodiment(s) of the invention is susceptible of several variations of implementation and various applications. The relations (1) to (3) or (1') to (3') described above show that a conventional logic circuit can be used to supply the reconstructed address, instead of pull-down or pull-up switches.

Moreover, it is possible to use the reconstructed address as a piece of information to detect a read error outside the memory. In this case, the memory comprises only a specific output to supply the address RADi as well as its complement NRADi. The process unit which uses the memory can for example, carry out the comparison of the addresses by itself and take any relevant measure in the event of comparison error, for example using software.

Such an external comparison can be performed in addition to the internal comparison performed by the comparison circuit CMPCT1, CMPCT2, or in order to replace the internal comparison. The sum of an internal and an external comparisons can has the advantage of enabling an error injection between the input of the memory receiving the address AD and the inputs of the decoders receiving the address Adi to be detected, for example an error injection in the control circuit CCT or in an address register. If the address ADi is the result of a conversion of the address applied AD, the processing unit must apply the reverse conversion function to the reconstructed address RADi supplied by the memory before comparing it to the address AD, or it must apply the conversion function to the address AD before comparing it to the address ADi.

Any relevant measure different from those aforementioned can be taken in the event of error detection, for example erasing sensitive data in the memory. If the error is indicated by a processing unit, for example a microprocessor, a reset of the processing unit or even a permanent decommissioning of the integrated circuit equipped with the memory can be provided.

The inputs of the address reconstruction circuits are connected to the ends of the word lines WLi and the column selection lines, on the opposite side of the outputs of the decoders, as it was previously described, so that the glitches introduced either into the decoders or at the level of the word lines or the column selection lines can be detected. However, these inputs can also be connected to some points of the decoders where voltage variations can be detected and where the voltage levels are compatible with the use of low-voltage transistors without voltage adaptation.

The interface circuit HLVC can also be manufactured with switches which only function is to insulate the circuits of address reconstruction of word lines and column selection lines outside memory read cycles, in particular during memory write cycles, during which high program and erase voltages are applied to these control lines.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

The above description of illustrated embodiments, including what is described in the Abstract, is not intended to be exhaustive or to limit the invention to the precise forms disclosed. While specific embodiments and examples are described herein for illustrative purposes, various equivalent modifications are possible within the scope of the invention and can be made without deviating from the spirit and scope of the invention.

These and other modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

TABLE 1

| ADi | | | Selection signals | | | | | | | |
|---|---|---|---|---|---|---|---|---|---|---|
| A2 | A1 | A0 | S0 | S1 | S2 | S3 | S4 | S5 | S6 | S7 |
| 0 | 0 | 0 | 1 | 0 | 0 | 0 | 0 | 0 | 0 | 0 |
| 0 | 0 | 1 | 0 | 1 | 0 | 0 | 0 | 0 | 0 | 0 |
| 0 | 1 | 0 | 0 | 0 | 1 | 0 | 0 | 0 | 0 | 0 |
| 0 | 1 | 1 | 0 | 0 | 0 | 1 | 0 | 0 | 0 | 0 |
| 1 | 0 | 0 | 0 | 0 | 0 | 0 | 1 | 0 | 0 | 0 |
| 1 | 0 | 1 | 0 | 0 | 0 | 0 | 0 | 1 | 0 | 0 |
| 1 | 1 | 0 | 0 | 0 | 0 | 0 | 0 | 0 | 1 | 0 |
| 1 | 1 | 1 | 0 | 0 | 0 | 0 | 0 | 0 | 0 | 1 |

TABLE 2

| S0 | S1 | S2 | S3 | S4 | S5 | S6 | S7 | A2 |
|---|---|---|---|---|---|---|---|---|
| 0 | 0 | 0 | 0 | 1 | 0 | 0 | 0 | 1 |
| 0 | 0 | 0 | 0 | 0 | 1 | 0 | 0 | 1 |
| 0 | 0 | 0 | 0 | 0 | 0 | 1 | 0 | 1 |
| 0 | 0 | 0 | 0 | 0 | 0 | 0 | 1 | 1 |

TABLE 3

| S0 | S1 | S2 | S3 | S4 | S5 | S6 | S7 | A1 |
|---|---|---|---|---|---|---|---|---|
| 0 | 0 | 1 | 0 | 0 | 0 | 0 | 0 | 1 |
| 0 | 0 | 0 | 1 | 0 | 0 | 0 | 0 | 1 |
| 0 | 0 | 0 | 0 | 0 | 0 | 1 | 0 | 1 |
| 0 | 0 | 0 | 0 | 0 | 0 | 0 | 1 | 1 |

TABLE 4

| S0 | S1 | S2 | S3 | S4 | S5 | S6 | S7 | A0 |
|---|---|---|---|---|---|---|---|---|
| 0 | 1 | 0 | 0 | 0 | 0 | 0 | 0 | 1 |
| 0 | 0 | 0 | 1 | 0 | 0 | 0 | 0 | 1 |

TABLE 4-continued

| S0 | S1 | S2 | S3 | S4 | S5 | S6 | S7 | A0 |
|---|---|---|---|---|---|---|---|---|
| 0 | 0 | 0 | 0 | 0 | 1 | 0 | 0 | 1 |
| 0 | 0 | 0 | 0 | 0 | 0 | 0 | 1 | 1 |

TABLE 5

(encoding with pull-down switches)

| Si | A2 (VL2) | A1 (VL1) | A0 (VL0) |
|---|---|---|---|
| S0 = 1 (HL0) | 0 | 0 | 0 |
| S1 = 1 (HL1) | 0 | 0 | 1 |
| S2 = 1 (HL2) | 0 | 1 | 0 |
| S3 = 1 (HL3) | 0 | 1 | 1 |
| S4 = 1 (HL4) | 1 | 0 | 0 |
| S5 = 1 (HL5) | 1 | 0 | 1 |
| S6 = 1 (HL6) | 1 | 1 | 0 |
| S7 = 1 (HL7) | 1 | 1 | 1 |

TABLE 6

(encoding with pull-up switches)

| Si | A2 (VL2) | A1 (VL1) | A0 (VL0) |
|---|---|---|---|
| S0 = 1 (HL0) | 0 | 0 | 0 |
| S1 = 1 (HL1) | 0 | 0 | 1 |
| S2 = 1 (HL2) | 0 | 1 | 0 |
| S3 = 1 (HL3) | 0 | 1 | 1 |
| S4 = 1 (HL4) | 1 | 0 | 0 |
| S5 = 1 (HL5) | 1 | 0 | 1 |
| S6 = 1 (HL6) | 1 | 1 | 0 |
| S7 = 1 (HL7) | 1 | 1 | 1 |

What is claimed is:

1. A method for reading a datum out of a memory having memory cells arranged in a memory array, the method comprising:
applying memory cells selection signals to the memory array according to a read address applied to the memory; and
reconstructing at least one part of the read address from the memory cells selection signals, to obtain a first reconstructed address, a bit of the reconstructed address being reconstructed by using switches arranged to bias to a first logic state a common output node which is biased by default to a second logic state, and by applying the memory cells selection signals to control terminals of the switches.

2. The method according to claim 1, further comprising:
comparing the first reconstructed address with at least one part of the read address; and
activating a first error signal if the reconstructed address is different from the read address.

3. The method according to claim 2, further comprising:
producing a second reconstructed address from the selection signals, which forms a 1's complement of the first reconstructed address;
comparing the first and the second reconstructed addresses; and
activating a second error signal if at least one bit of the second reconstructed address is equal to a bit of a same rank of the first reconstructed address.

4. The method according to claim 3, further comprising activating a global error signal if at least one of the two error signals is activated.

5. The method according to claim 1 wherein the reconstructed address comprises a same number of bits as the read address.

6. The method according to claim 1 wherein the selection signals are converted into low-voltage signals before being applied to the control terminals of the switches.

7. The method according to claim 1 wherein the memory includes:
the memory array having the memory cells coupled to word lines and to bit lines, the bit lines being arranged into columns to form columns;
a line decoder supplying word line selection signals according to the read address; and
a column decoder supplying column selection signals according to the read address,
wherein the reconstructed address is both determined by word line selection signals and column selection signals.

8. A memory, comprising:
memory cells arranged in a memory array;
an address decoder to apply memory cells selection signals to the memory array according to a read address applied to the memory; and
an address reconstruction circuit to supply a first reconstructed address by reconstruction of at least one part of the read address from the memory cells selection signals, the address reconstruction circuit including:
at least one group of switches arranged to bias to a first logic state an output node common to the switches, which supplies a bit of the reconstructed address;
an element to bias the output node by default to a second logic state; and
means for applying the memory cells selection signals to control terminals of the switches.

9. The memory according to claim 8, further comprising a comparison circuit to compare the reconstructed address with at least one part of the read address, and to activate a first error signal if the reconstructed address is different from the read address.

10. The memory according to claim 9 wherein the address reconstruction circuit also supplies a second reconstructed address which forms a 1's complement of the first reconstructed address.

11. The memory according to claim 10, further comprising a comparison circuit to compare the first and the second reconstructed addresses, and to activate a second error signal if at least one bit of the second reconstructed address is equal to a bit of a same rank as the first reconstructed address.

12. The memory according to claim 8 wherein the address reconstruction circuit comprises address reconstruction modules having common outputs and operating alternately to alternately supply different parts of the reconstructed address.

13. The memory according to claim 8, further comprising:
the memory array having the memory cells coupled to word lines and to bit lines, bit lines being arranged into columns to form word columns;
a line decoder to supply word line selection signals according to the read address;
a column decoder to supply column selection signals according to the read address;
a word line address reconstruction circuit, to supply a reconstructed word line address from the word line selection signals; and
a column address reconstruction circuit, to supply a reconstructed column address from the column selection signals.

14. The memory according to claim 8, further comprising an interface circuit to insulate the address reconstruction circuit from the selection signals applied to the memory array when the memory is not in a reading phase of the memory array.

15. The memory according to claim 8, further comprising an interface circuit to lower a voltage of the selection signals applied to the memory array before applying them to the address reconstruction circuit.

16. The memory according to claim 15 wherein the interface circuit comprises components of not used memory cells that are present on edges of the memory array.

17. A system for reading data from a memory having memory cells arranged in a memory array, the system comprising:
  means for applying memory cells selection signals to the memory array according to a read address applied to the memory; and
  means for reconstructing at least one part of the read address from the memory cells selection signals, to obtain a first reconstructed address, said reconstructing means including:
    at least one group of switches arranged to bias to a first logic state an output node common to the switches, which supplies a bit of the reconstructed address;
    an element to bias the output node by default to a second logic state; and
    means for applying the memory cells selection signals to control terminals of the switches.

18. The system of claim 17, further comprising:
  means for comparing the first reconstructed address with at least one part of the read address;
  means for activating a first error signal if the reconstructed address is different from the read address;
  means for producing a second reconstructed address from the selection signals, which forms a 1's complement of the first reconstructed address;
  means for comparing the first and the second reconstructed addresses; and
  means for activating a second error signal if at least one bit of the second reconstructed address is equal to a bit of a same rank of the first reconstructed address.

19. The system of claim 18, further comprising means for activating a global error signal if at least one of the two error signals is activated.

20. A memory device, comprising:
  a plurality of memory cells arranged in a memory array;
  a control circuit to provide a read address;
  an address decoder coupled to the memory array and to the control circuit to apply memory cells selection signals to the memory array according to the read address provided by the control circuit; and
  an address reconstruction circuit coupled to the memory array to reconstruct at least one part of the read address from the memory cells selection signals, and to supply a first reconstructed address, said address reconstruction circuit including:
    at least one group of switches arranged to bias to a first logic state an output node common to the switches, which supplies a bit of the reconstructed address;
    an element coupled to the output node to bias the output node by default to a second logic state; and
    a circuit block coupled to the switches to apply the memory cells selection signals to control terminals of the switches.

21. The memory device of claim 20, further comprising a comparison circuit coupled to the address reconstruction circuit and to the control circuit to compare the reconstructed address with at least one part of the read address, the comparison circuit being structured to activate a first error signal if the reconstructed address is different from the read address.

22. The memory device of claim 21 wherein the address reconstruction circuit also supplies a second reconstructed address which forms a 1's complement of the first reconstructed address, and wherein the comparison circuit is further structured to compare the first and the second reconstructed addresses, and to activate a second error signal if at least one bit of the second reconstructed address is equal to a bit of a same rank as the first reconstructed address.

23. The memory device of claim 20 wherein the memory array has the memory cells coupled to word lines and to bit lines, the bit lines being arranged to form word columns, the memory device further comprising:
  a line decoder included with the address decoder and coupled to the memory array to supply word line selection signals according to the read address provided by the control circuit;
  a column decoder included with the address decoder and coupled to the memory array to supply column selection signals according to the read address provided by the control circuit;
  a word line address reconstruction circuit included with the address reconstruction circuit to supply a reconstructed word line address from the word line selection signals; and
  a column address reconstruction circuit included with the address reconstruction circuit to supply a reconstructed column address from the column selection signals.

* * * * *